United States Patent [19]
Gantioler et al.

[11] Patent Number: 5,633,515
[45] Date of Patent: May 27, 1997

[54] SEMICONDUCTOR COMPONENT ARRANGEMENT FOR OVERVOLTAGE PROTECTION OF MOSFETS AND IGBTS

[75] Inventors: Josef-Matthias Gantioler; Alfred Porst, both of Munich; Jenoe Tihanyi, Kirchheim; Hans Stut, deceased, late of Groebenzell, all of Germany, by Lieselotte Stut, heir

[73] Assignee: Siemens Aktiengesellschaft, Munich, Germany

[21] Appl. No.: 398,126

[22] Filed: Mar. 3, 1995

[30] Foreign Application Priority Data

Mar. 4, 1994 [DE] Germany ............................ 44 07 279.1

[51] Int. Cl.$^6$ .................................................. H01C 27/02
[52] U.S. Cl. ........................................ 257/140; 257/143
[58] Field of Search .................................. 257/133, 140, 257/146, 154, 168, 173, 139, 161

[56] References Cited

U.S. PATENT DOCUMENTS

| | | | |
|---|---|---|---|
| 5,294,843 | 3/1994 | Tursky et al. | 257/656 |
| 5,360,984 | 11/1994 | Kirihata | 257/140 |

FOREIGN PATENT DOCUMENTS 0566179  10/1993  European Pat. Off. .

OTHER PUBLICATIONS

J. Enzinger et al., "SMART–Power–Bauelemente auf der Basis der SIPMOS–Technologie", Markt & Technik, Design & Elektronik, Ausgabe 21, Oct. 14, 1986.

Primary Examiner—Sara W. Crane
Assistant Examiner—David B. Hardy
Attorney, Agent, or Firm—Hill, Steadman & Simpson

[57] ABSTRACT

MOSFET and IGBT components protected against overvoltage by a limiting diode inserted between drain or, respectively, collector terminal and gate terminal are provided. A freewheeling diode connected to the component having a limiting diode with a breakdown voltage that is lower than the breakdown voltage of the freewheeling diode by a defined amount is provided. This over-voltage protection can be achieved in a simple way by integrating the limiting diode into the semiconductor body of the freewheeling diode and by a corresponding arrangement of the anode zone of the limiting diode.

5 Claims, 2 Drawing Sheets

SEMICONDUCTOR COMPONENT ARRANGEMENT FOR OVERVOLTAGE PROTECTION OF MOSFETS AND IGBTS

BACKGROUND OF THE INVENTION

1. Field of the Invention

The invention is directed generally to semiconductors and more specifically to a semiconductor component for overvoltage protection of semiconductor components controllable by field effect having a freewheeling diode connected thereto, and having a voltage-limiting diode connected between the collector (drain) terminal and the gate terminal.

2. Description of the Related Art

Such a circuit arrangement has been described, for example, in the article "SMART-Power-Bauelemente auf der Basis der SIPMOS-Technologie", Elektronik 1987, Special Number Stromversorgungen, pp. 39–42, particularly FIG. 3. This figure has been reproduced as FIG. 4 of the present application. FIG. 4 shows an IGBT 1 having a freewheeling diode 4 connected between the collector terminal and the emitter terminal. The cathode terminal of the freewheeling diode 4 is connected to the collector terminal and the anode is connected to the emitter of the IGBT 1. In addition, a cathode terminal of a limiting diode 2 is connected to the collector terminal and its anode terminal is connected to the gate terminal of the IGBT 1 via a diode 3. The anode of the diode 3 is connected to the anode of limiting diode 2.

When an inductive load is shut off, a high voltage occurs at the IGBT 1 and, thus, at the freewheeling diode 4. In order to preclude jeopardizing the components, the IGBT 1 is switched slightly conductive via the limiting diode 2 and the diode 3 in case of an overvoltage. The shutoff speed is thus reduced and the over-voltage generated upon shut-off is correspondingly reduced.

For the described protective effect, the breakdown voltage of the limiting diode 2 must always lie below the breakdown voltage of the freewheeling diode 4 by a defined voltage. Since these voltages are temperature-dependent and the diodes are traversed by highly different currents, and thus, are warmed to different degrees, the spacing between the two breakdown voltages is not always maintained.

SUMMARY OF THE INVENTION

It is an object of the present invention to provide a component of the species initially cited wherein the breakdown voltage of the limiting diode always lies below the breakdown voltage of the freewheeling diode.

The object is inventively achieved in the present invention by integrating a limiting diode into a semiconductor body of a freewheeling diode such that the limiting diode has a breakdown voltage lower than the breakdown voltage of the freewheeling diode wherein the two diodes have separate anode terminals.

The invention shall be set forth in greater detail with reference to three exemplary embodiments as illustrated in the accompanying figures.

DETAILED DESCRIPTION OF THE PREFERRED EMBODIMENTS

Figure 1:
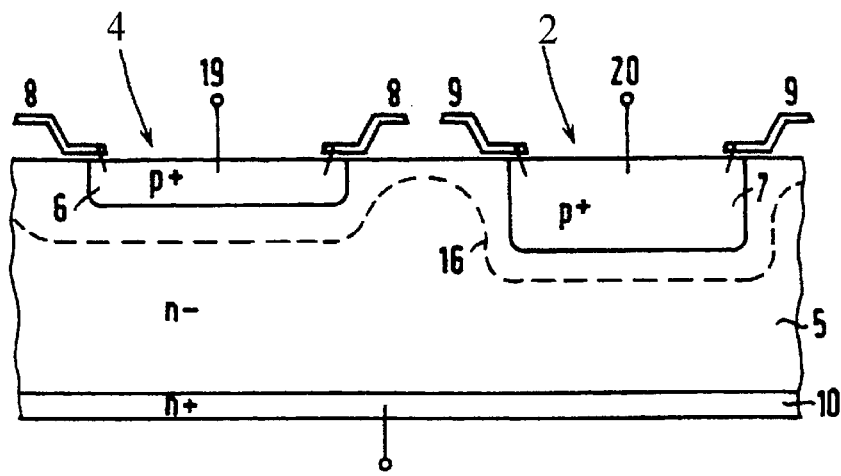
FIG. 1 illustrates an embodiment of the present invention.
Figure 2:
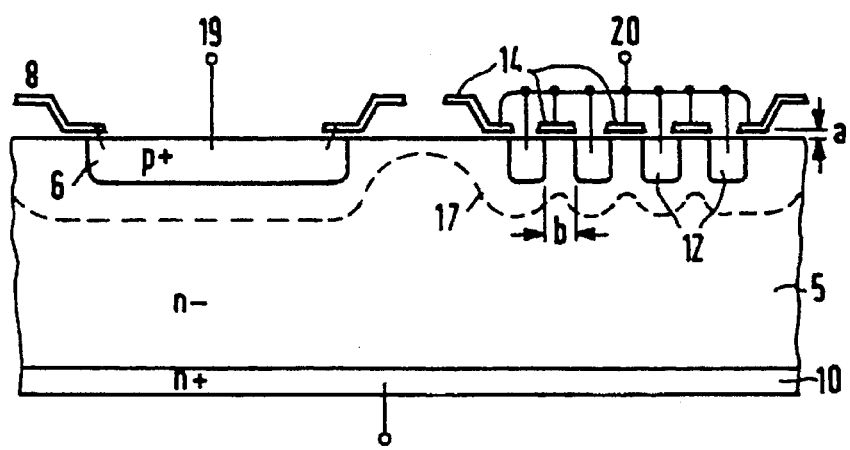
FIG. 2 illustrates an embodiment of the present invention.
Figure 3:
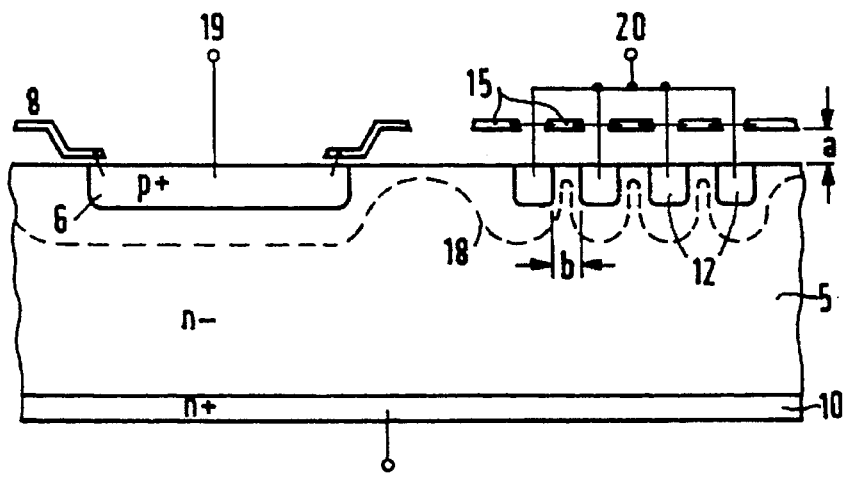
FIG. 3 illustrates an embodiment of the present invention.
Figure 4:
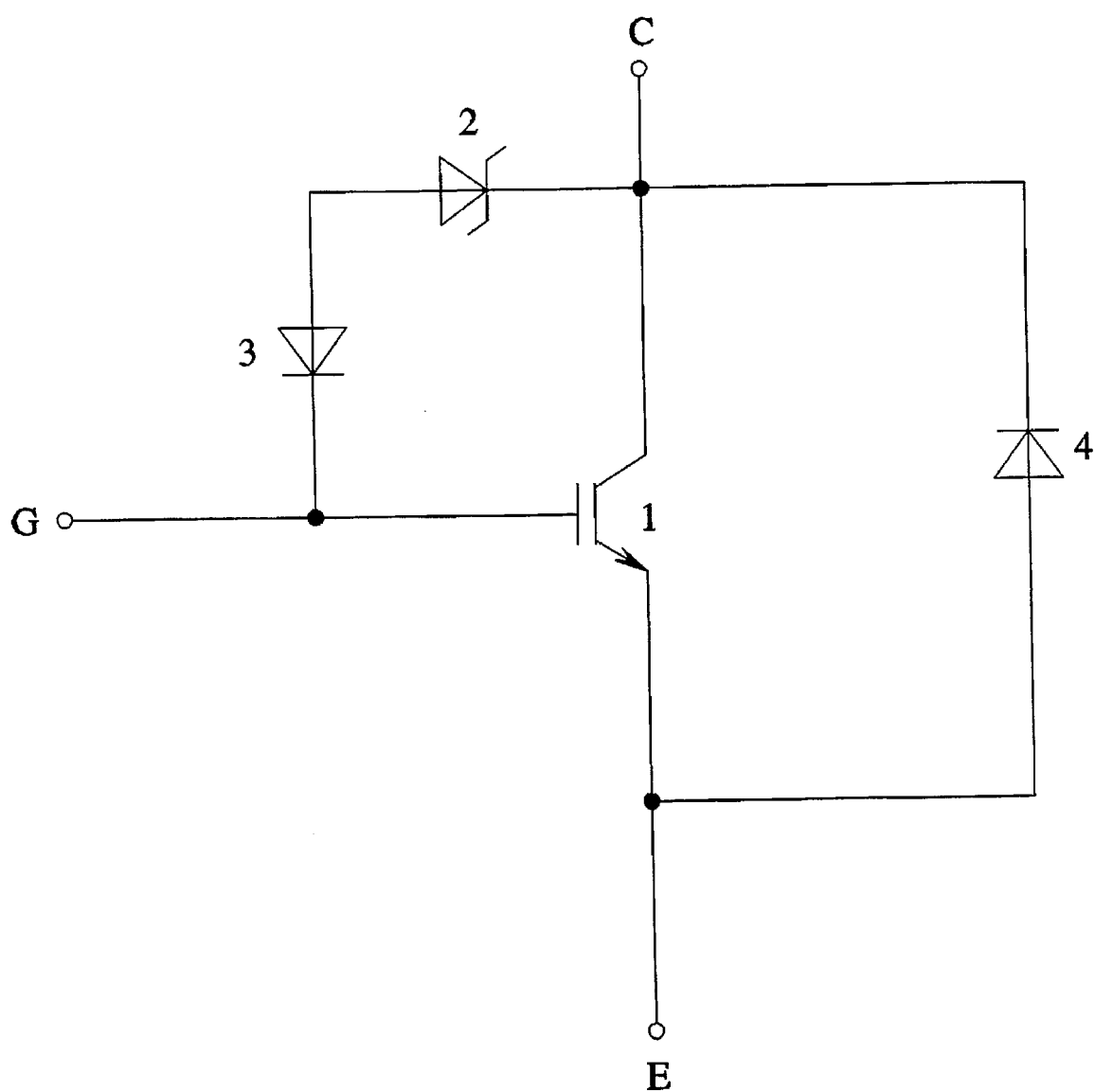
FIG. 4 illustrates a prior art circuit.

In FIGS. 1–3, a lightly n-doped semiconductor body 5 is shared in common by a limiting diode 2 and a freewheeling diode 4. A highly n-doped cathode zone is referenced 10. An anode terminal of the freewheeling diode 4 is referenced 19 and an anode terminal of the limiting diode 2 is referenced 20.

An anode zone of the freewheeling diode 4 in FIG. 1 is referenced 6, and an anode zone of the limiting diode 2 is referenced 7. In order to achieve a breakdown of the limiting diode 2 at a voltage that lies lower than that of the freewheeling diode 4, the anode zone 7 of the limiting diode 2 is driven more deeply into the semiconductor body 5 than the anode zone 6.

Equipotential lines that are more highly curved in the region of the anode zone 7 than in the region of the anode zone 6 result when a blocking voltage is applied. This is shown by way of example by a single equipotential line 16 entered in broken lines. The course of equipotential lines can also be influenced by field electrodes that are insulated from the surface of the semiconductor body 5 and that overlap the anode zones 6, 7. A field electrode 8 is allocated to the freewheeling diode 4, and a field electrode 9 is allocated to the limiting diode 2. Each electrode 8, 9 is respectively electrically connected to the anode zones 6, 7. The amount of the influencing by the field electrodes depends on the lateral expanse of the field electrodes and on the distance from the surface of the semiconductor body 5. The distance is defined by the thickness of the insulating layers, i.e. of the oxide layers on which the field electrodes 8, 9 are seated.

As shown in FIG. 2, the limiting diode 2 can also have an anode zone that is composed of a plurality of small-area cells 12 instead of having the single-piece anode zone 7. These cells 12 are connected electrically parallel to one another. The course of the equipotential lines (only a single one is entered in broken lines and referenced 17) can be set by a spacing b of the cells 12 and by a distance a of field electrodes 14 from the surface of the semiconductor body 5. When the distance a is small, then the equipotential lines have a relatively softly curved course in the region of the anode zone of the limiting diode. Compared to the curvature of the electrical field in the region of the anode zone 6, however, the curvature of the electrical field is greater. The breakdown voltage of the limiting diode 2 thus becomes lower than that of the freewheeling diode 4. The curvature of the equipotential lines, as shown at 18 in FIG. 3, can be increased in the region of the limiting diode by increasing the distance a of field electrodes 15 from the surface of the semiconductor body 5. The equipotential lines in the region of the anode zone 7 of the limiting diode 2 thus assume a highly peaked wave shape and, thus, a highly curved course. The breakdown voltage of the limiting diode 2 thus lies under the breakdown voltage of the limiting diode 2 in the embodiment of FIG. 2.

The curvature can also be varied by modifying the spacing b between the cells. An increase in the spacing b thereby produces a lower breakdown voltage. A reduction in the spacing b produces a higher breakdown voltage.

It is necessary that the field electrodes overlap the anode zones or, respectively, the cells 12. As known, the breakdown voltage of the freewheeling diode 4 can also be varied on the basis of the shape of its field electrodes. However, the breakdown voltage of the limiting diode 2 must always be lower than that of the freewheeling diode 4. In case the freewheeling diode 4 is heated and its breakdown voltage drops, the limiting diode 2 is also heated, so that its breakdown voltage likewise drops.

The areas of the anode zones for the freewheeling diode 4 and for the limiting diode are respectively shown of approximately equal size in the exemplary embodiments. This, however, is not to be understood as being true-to-scale. Of course, the freewheeling diode 4 must have a significantly larger area because of the significantly higher currents it experiences.

The integrated diode arrangement can be dimensioned in a simple way for any desired blocking voltage by doping the semiconductor body zone 5 and selecting its thickness in accord with the desired blocking voltage in a known way.

The field electrodes 14, 15 in the exemplary embodiments of FIGS. 2 and 3 have a constant distance from the surface. Over, for example, the zone 5, however, they can also have a greater distance from the surface than over the pn-junctions between the zone 5 and the zones 12, i.e. the field plates between the zones 12 lie at, for example, two different distances from the surface.

The present invention has been set forth for an IGBT. Of course, it can likewise be used for a MOSFET.

Although other modifications and changes may be suggested by those skilled in the art, it is the intention of the inventors to embody within the patent warranted hereon all changes and modifications as reasonably and properly come within the scope of their contribution to the art.

We claim:

1. Semiconductor component arrangement including a semiconductor body for overvoltage protection of semiconductor components controllable by field effect having a freewheeling diode connected thereto, comprising:

said freewheeling diode being integrated into said semiconductor body; and a voltage limiting diode integrated into said semiconductor body, said voltage limiting diode having a breakdown voltage that is lower than a breakdown voltage of said freewheeling diode, said diodes having separate anode terminals.

2. Semiconductor component arrangement according to claim 1, wherein said freewheeling diode and said voltage limiting diode each further include respective anode zones driven into said semiconductor body such that said anode zone of said voltage limiting diode has a greater depth than said anode zone of said freewheeling diode.

3. Semiconductor component arrangement according to claim 1, wherein said freewheeling diode and said voltage limiting diode each further include respective anode zones driven into said semiconductor body; and wherein said anode zone of said freewheeling diode is a single zone; and said anode zone of said limiting diode is of a plurality of cells connected parallel to one another.

4. Semiconductor component according to claim 3, wherein said anode zone of said freewheeling diode and said anode zone of said limiting diode have equal depth.

5. Semiconductor component arrangement according to claim 1, wherein said freewheeling diode and said voltage limiting diode each further include respective anode zones driven into said semiconductor body; and further comprising:

first field electrodes that overlap said anode zone of said freewheeling diode arranged over the anode-side surface of said semiconductor body; and second field electrodes that overlap said anode zone of said limiting diode.

* * * * *